United States Patent
Chang et al.

(10) Patent No.: US 10,461,252 B2
(45) Date of Patent: Oct. 29, 2019

(54) RESISTIVE RANDOM ACCESS MEMORY

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Chih-Cheng Shih, Kaohsiung (TW); Chih-Hung Pan, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 374 days.

(21) Appl. No.: 15/213,583

(22) Filed: Jul. 19, 2016

(65) Prior Publication Data

US 2017/0317281 A1 Nov. 2, 2017

(30) Foreign Application Priority Data

Apr. 27, 2016 (TW) .............................. 105113173 A (51) Int. Cl.
*H01L 27/24* (2006.01)
*H01L 45/00* (2006.01)

(52) U.S. Cl.
CPC .......... *H01L 45/1246* (2013.01); *H01L 27/24* (2013.01); *H01L 45/08* (2013.01);
(Continued)

(58) Field of Classification Search
CPC . H01L 45/1246; H01L 45/085; H01L 45/146; H01L 45/1253; H01L 45/1233
See application file for complete search history.

(56) References Cited

U.S. PATENT DOCUMENTS

| 4,509,035 A | * | 4/1985 | Harata | ................. G01N 27/121 338/35 |
| 7,696,077 B2 | * | 4/2010 | Liu | ..................... H01L 27/2463 257/3 |

(Continued)

FOREIGN PATENT DOCUMENTS

| TW | 200824046 A | 6/2008 |
| TW | 201440273 A | 10/2014 |
| TW | 201521250 A | 6/2015 |

OTHER PUBLICATIONS

Chang, Kuan-Chang, Characteristics and Mechanisms of Silicon-Oxide-Based Resistance Random Access Memory, Mar. 2013, IEEE Electron Device Letters, vol. 34, pp. 399-401.*

(Continued)

*Primary Examiner* — Charles D Garber
*Assistant Examiner* — S M Sohel Imtiaz
(74) *Attorney, Agent, or Firm* — Alan D. Kamrath; Karin L. Williams; Mayer & Williams PC (57) ABSTRACT

A resistive random access memory overcomes the low durability of the conventional resistive random access memory. The resistive random access memory includes a first electrode, a second electrode, an enclosing layer and an oxygen-containing resistance changing layer. The first and second electrodes are separate from each other. The enclosing layer forms a first via-hole. The oxygen-containing resistance changing layer is arranged for the first via-hole. The first and second electrodes and the enclosing layer jointly enclose the oxygen-containing resistance changing layer. Each of the first electrode, the second electrode and the enclosing layer is made of an element not containing oxygen.

15 Claims, 5 Drawing Sheets

(52) U.S. Cl.
CPC ........ *H01L 45/085* (2013.01); *H01L 45/1233* (2013.01); *H01L 45/1253* (2013.01); *H01L 45/146* (2013.01)

(56) References Cited

U.S. PATENT DOCUMENTS

| | | | |
|---|---|---|---|
| 9,123,889 B2 | 9/2015 | Terai | |
| 9,231,203 B1* | 1/2016 | Tendulkar | ............. H01L 45/145 |
| 9,373,665 B2 | 6/2016 | Terai | |
| 2008/0064217 A1* | 3/2008 | Horii | ........................ H01L 45/06 438/703 |
| 2010/0044669 A1* | 2/2010 | Happ | ...................... H01L 45/06 257/3 |
| 2010/0102291 A1* | 4/2010 | Xu | ........................ G11C 13/02 257/4 |
| 2012/0063201 A1* | 3/2012 | Hayakawa | ......... G11C 13/0007 365/148 |
| 2012/0305880 A1* | 12/2012 | Zhang | ................. G11C 13/0007 257/4 |
| 2013/0010529 A1* | 1/2013 | Hayakawa | ............ H01L 27/101 365/148 |
| 2013/0032775 A1* | 2/2013 | Satoh | ...................... H01L 45/04 257/1 |
| 2013/0256623 A1* | 10/2013 | Kim | .................... H01L 45/1233 257/4 |
| 2014/0008567 A1* | 1/2014 | Wang | ....................... C09G 1/02 252/79.4 |
| 2014/0029330 A1* | 1/2014 | Muraoka | ............... H01L 27/101 365/148 |
| 2015/0207071 A1* | 7/2015 | Ode | .................... H01L 27/2409 257/4 |
| 2016/0035416 A1* | 2/2016 | Sugimae | ............. G11C 13/004 365/148 |

OTHER PUBLICATIONS

Kuan-Chang Chang et al., Characteristics and Mechanisms of Silicon-Oxide-Based Resistance Random Access Memory, IEEE Electron Device Letters, Mar. 2013, pp. 399-401, vol. 34 No. 3.

* cited by examiner

RESISTIVE RANDOM ACCESS MEMORY

CROSS REFERENCE TO RELATED APPLICATIONS

The application claims the benefit of Taiwan application serial No. 105113173, filed on Apr. 27, 2016, and the subject matter of which is incorporated herein by reference.

BACKGROUND OF THE INVENTION

1. Field of the Invention

The present disclosure generally relates to a resistive random access memory and, more particularly, to a resistive random access memory having an oxygen-containing resistance changing layer enclosed by materials that do not contain oxygen.

2. Description of the Related Art

Memories have been widely used in various electronic products. Due to the increasing need of data storage, the demands of the capacities and performances of the memories become higher and higher. Among various memory elements, resistive random access memories (RRAMs) have an extremely low operating voltage, an extremely high read/write speed, and high miniaturization of the element size and, thus, may replace the conventional flash memories and dynamic random access memories (DRAMs) as the main stream of memory elements of the next generation.

A conventional resistive random access memory generally includes a bottom electrode, a dielectric layer, a resistance changing layer and an upper electrode. The dielectric layer is arranged on the bottom electrode. The dielectric layer forms a first via-hole. The surface of the bottom electrode is partially exposed to the first via-hole. As such, the resistance changing layer extends from the surface of the bottom electrode, which is exposed to the first via-hole, to an upper surface of the dielectric layer. The upper electrode is arranged on the resistance changing layer. In the above arrangement, an electric field can be applied to switch the resistance changing layer between a low resistance state (LRS) and a high resistance state (HRS). Such a resistive random access memory can be seen in the academic paper entitled "Characteristics and Mechanisms of Silicon-Oxide-Based Resistance Random Access Memory" as published on IEEE ELECTRON DEVICE LETTERS, VOL. 34, NO. 3 on March 2013.

However, after the conventional resistive random access memory operates in a certain number of times, the oxygen ions in the resistance changing layer will gradually disperse. As a result, the resistances of LRS and HRS will gradually become close to each other. For example, after the resistive random access memory is operated for a certain number of times (such as $1*10^8$ times), the resistive random access memory will become inoperable due to the small difference between the resistances of LRS and HRS. Thus, the durability of the conventional resistive random access memory is low.

In light of this, it is necessary to improve the conventional resistive random access memory.

SUMMARY OF THE INVENTION

It is therefore the objective of this disclosure to provide a resistive random access memory with high durability.

In an embodiment of the disclosure, a resistive random access memory including a first electrode, a second electrode, an enclosing layer and an oxygen-containing resistance changing layer is disclosed. The first and second electrodes are separate from each other. The enclosing layer forms a first via-hole. The oxygen-containing resistance changing layer is arranged for the first via-hole. The first and second electrodes and the enclosing layer jointly enclose the oxygen-containing resistance changing layer. Each of the first electrode, the second electrode and the enclosing layer is made of element not containing oxygen.

In a form shown, each of the first and second electrodes may be made of a metal material not containing oxygen. The metal material may include iridium, platinum, gold, titanium nitride, hafnium, tantalum or tungsten. The enclosing layer may be formed from silicon carbide, silicon nitride or boron nitride. The oxygen-containing resistance changing layer is formed from oxides doped with one or more of elements including boron, carbon, nitrogen, fluorine, chlorine and bromine. As such, the redox reaction can be limited in the oxygen-containing resistance changing layer while the first electrode, the second electrode and the enclosing layer are free from the redox reaction. After the redox reaction, the switching effect of the resistance states can be enhanced.

In the form shown, the enclosing layer may be mounted on one of the first and second electrodes. The oxygen-containing resistance changing layer may extend from a top face of the one of the first and second electrodes, which is exposed to the first via-hole, to a top face of the enclosing layer. The oxygen-containing resistance changing layer forms a recess. The oxygen-containing resistance changing layer has a part that is located outside the first via-hole, and the part may be jointly enclosed by the enclosing layer and another one of the first and second electrodes. The oxygen-containing resistance changing layer may be completely located in the first via-hole. Another one of the first and second electrodes may extend out of the first via-hole from the oxygen-containing resistance changing layer and forms a second via-hole. The second via-hole is located in the first via-hole. One of the first and second electrodes may be arranged in the first via-hole. The oxygen-containing resistance changing layer may be completely located in the first via-hole. The oxygen-containing resistance changing layer may be arranged across an opening of the first via-hole. The oxygen-containing resistance changing layer includes a bottom portion, an oxygen-rich portion and a top portion stacked upon one another. The oxygen-rich portion is formed from the oxides doped with less than 10% of a metal element. In this arrangement, the redox reaction can be limited in the oxygen-containing resistance changing layer by the first electrode, the second electrode and the enclosing layer. As such, the oxygen ions in the oxygen-containing resistance changing layer will not disperse as the resistive random access memory operates in an increased number of times. This prevents the resistive random access memory from having undistinguishable resistance states, thereby preventing the errors in reading date.

In the resistive random access memory above, the first electrode, the second electrode and the enclosing layer can jointly enclose the oxygen-containing resistance changing layer, and the first electrode, the second electrode and the enclosing layer are made of an element not containing oxygen. As such, the redox reaction can be limited in the oxygen-containing resistance changing layer. As such, the dispersion of the oxygen ions of the oxygen-containing resistance changing layer can be prevented or reduced after the resistive random access memory operates in a large number of times. Advantageously, the distinguishability of the resistance states is not affected, and the data errors do not result. Thus, the durability is high, the service life is prolonged, and the data errors are avoided. In contrast to the disadvantage of the conventional resistive random access memory, the resistive random access memory of the disclosure has a high durability and utility.

BRIEF DESCRIPTION OF THE DRAWINGS

The present disclosure will become more fully understood from the detailed description given hereinafter and the accompanying drawings which are given by way of illustration only, and thus are not limitative of the present invention, and wherein.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Figure 1:
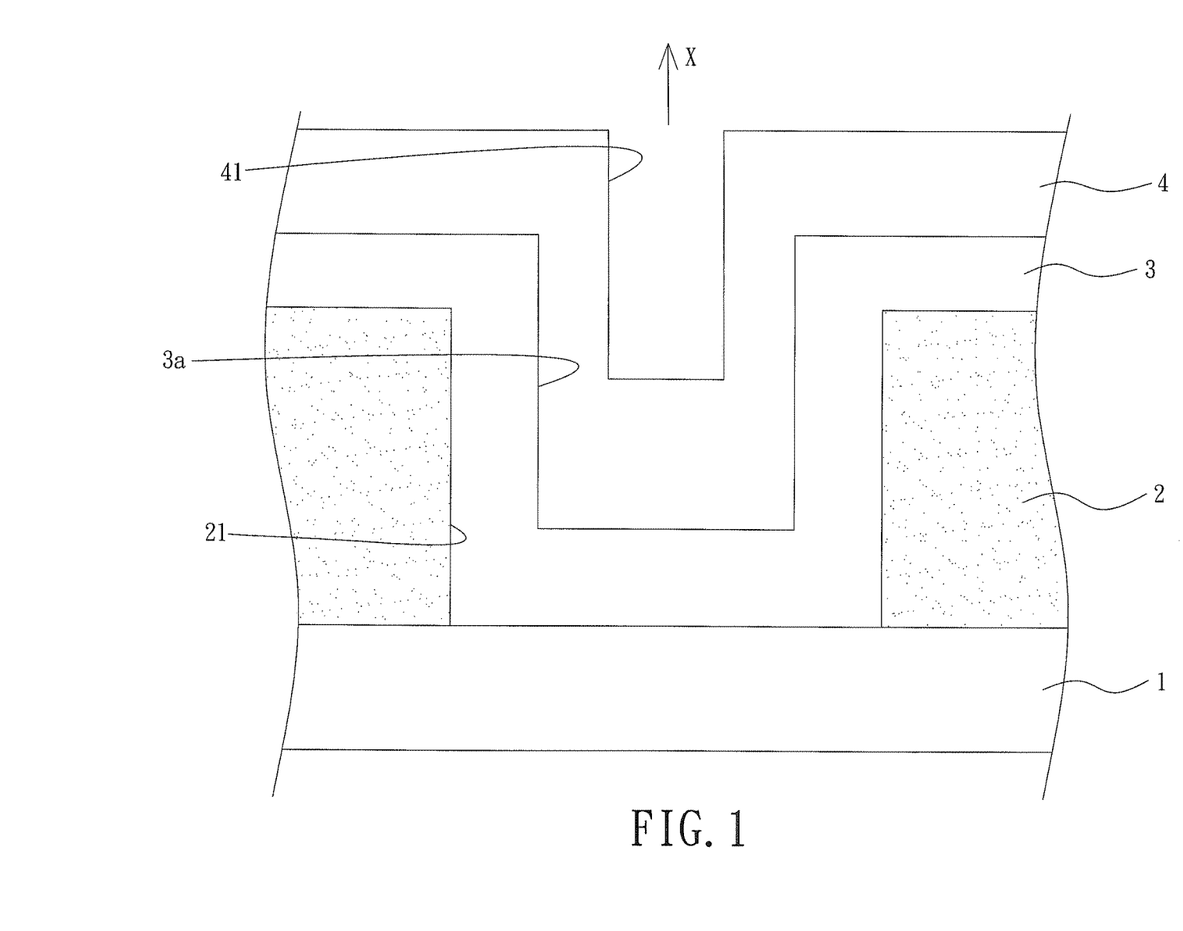
FIG. 1 is a cross sectional view of a resistive random access memory according to a first embodiment of the disclosure.

FIG. 1 is a cross sectional view of a resistive random access memory according to a first embodiment of the disclosure. The resistive random access memory may include two separate electrodes (including a first electrode 1 and a second electrode 4 as shown in FIG. 1), an enclosing layer 2 and an oxygen-containing resistance changing layer 3. The enclosing layer 2 may form a first via-hole 21 extending in an X direction. The first via-hole 21 is arranged with the oxygen-containing resistance changing layer 3. The first electrode 1, the enclosing layer 2 and the second electrode 4 jointly enclose the first via-hole 21. Each of the first electrode 1, the enclosing layer 2 and the second electrode 4 is made of elements not containing oxygen. The resistive random access memory of the first embodiment of the disclosure is elaborated below, but this is not used to limit the disclosure.

In the first embodiment shown in FIG. 1, both the first electrode 1 and the second electrode 4 may be made of a metal material not containing oxygen. The metal material may include iridium (Ir), platinum (Pt), gold (Au), titanium nitride (TiN), hafnium (Hf), tantalum (Ta) or tungsten (W) in order to avoid the oxidation reaction. The enclosing layer 2 may be formed from non-oxides such as silicon carbide (SiC), silicon nitride (Si3N4) or boron nitride (BN) in order to avoid the oxidation reaction. The oxygen-containing resistance changing layer 3 may be formed from oxides (such as SiO2 or HfO2) doped with one or more elements that can absorb oxygen, such as boron (B), carbon (C), nitrogen (N), fluorine (F), chlorine (Cl) and bromine (Br). Such doping can enhance the oxidation reaction. In this arrangement, the first electrode 1, the enclosing layer 2 and the second electrode 4 which do not contain oxygen can jointly enclose the oxygen-containing resistance changing layer 3, to ensure that the oxidation reaction takes place only in the oxygen-containing resistance changing layer 3. In this arrangement, the dispersion of the oxygen ions which are under the reaction can be prevented. Advantageously, the resistive random access memory will not encounter the problem of low durability resulting from the dispersion of the oxygen ions. In the following, other embodiments of the resistive random access memory are described, in which the shapes and locations of the first electrode 1, second electrode 4 and the oxygen-containing resistance changing layer 3 can be changed.

Figure 2:
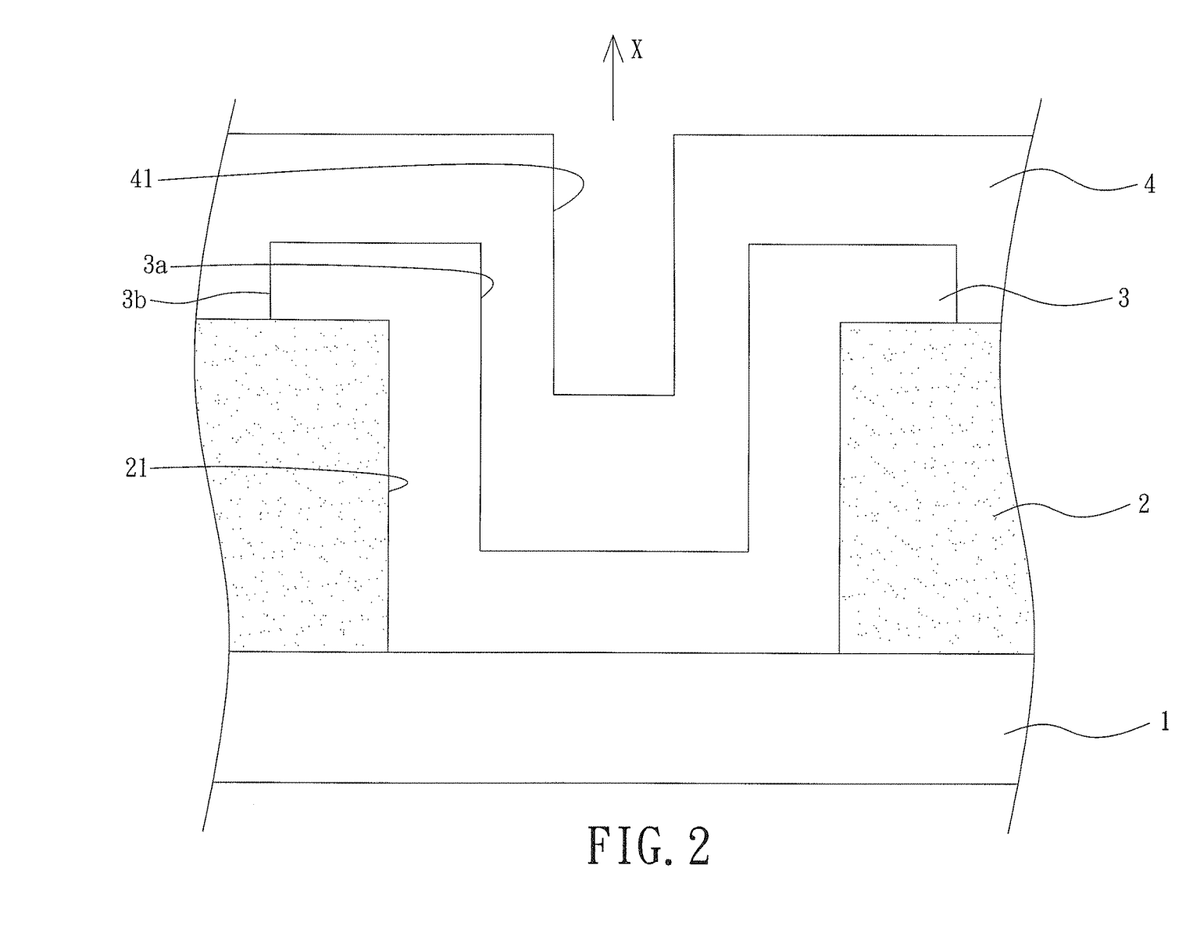
FIG. 2 is a cross sectional view of a resistive random access memory according to a second embodiment of the disclosure.
Figure 3:
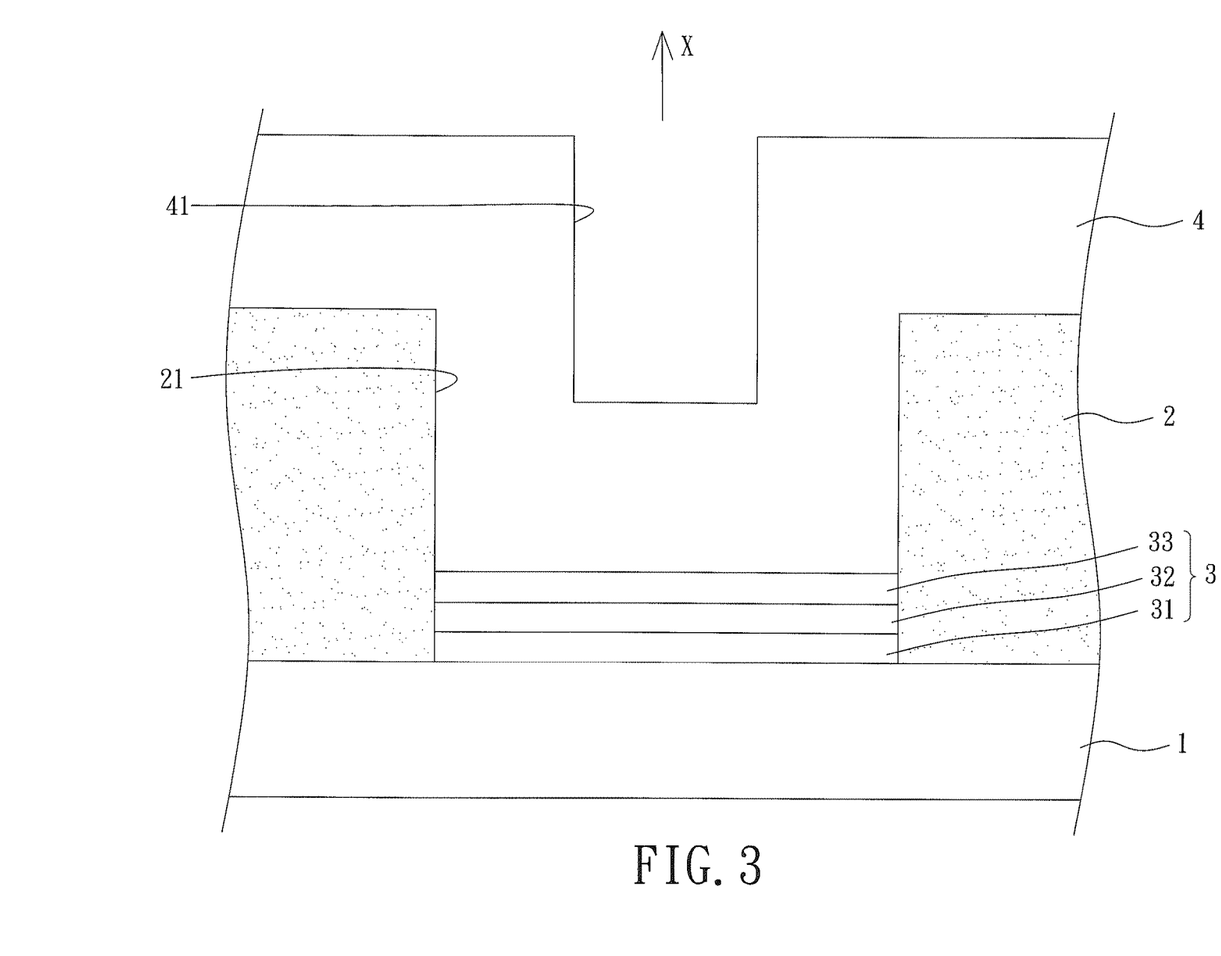
FIG. 3 is a cross sectional view of a resistive random access memory according to a third embodiment of the disclosure.

For example, as shown in FIGS. 1-3, the bottom face of the enclosing layer 2 may be in contact with the top face of the first electrode 1. As such, the top face of the first electrode 1 is partially exposed to the first via-hole 21. In this arrangement, the oxygen-containing resistance changing layer 3 extends from the top face of the first electrode 1, which is exposed to the first via-hole 21, to the top face of the enclosing layer 2 (as shown in FIG. 1). The oxygen-containing resistance changing layer 3 may form a recess 3a (as shown in FIGS. 1 and 2). The part 3b of the oxygen-containing resistance changing layer 3 that is located outside the first via-hole 21 may be jointly enclosed by the enclosing layer 2 and the second electrode 4 (as shown in FIG. 2). Thus, the oxygen ions can be better limited in place. The oxygen-containing resistance changing layer 3 can be completely located in the first via-hole 21 in which said oxygen-containing resistance changing layer 3 includes a bottom portion 31, an oxygen-rich portion 32 and a top portion 33 stacked upon one another. The oxygen-rich portion 32 may be formed from the oxides doped with less than 10% of a metal element, including gadolinium (Gd), titanium (Ti), zirconium (Zr), hafnium (Hf), tantalum (Ta) or tungsten (W), which has excellent electricity conductivity. As such, the limiting effect of the oxygen ions is enhanced, and the reaction of the oxygen ions is facilitated. The second electrode 4 may extend out of the first via-hole 21 from the oxygen-containing resistance changing layer 3 and may form a second via-hole 41. The second via-hole 41 is located in the first via-hole 21. However, this is not used to limit the disclosure.

Figure 4:
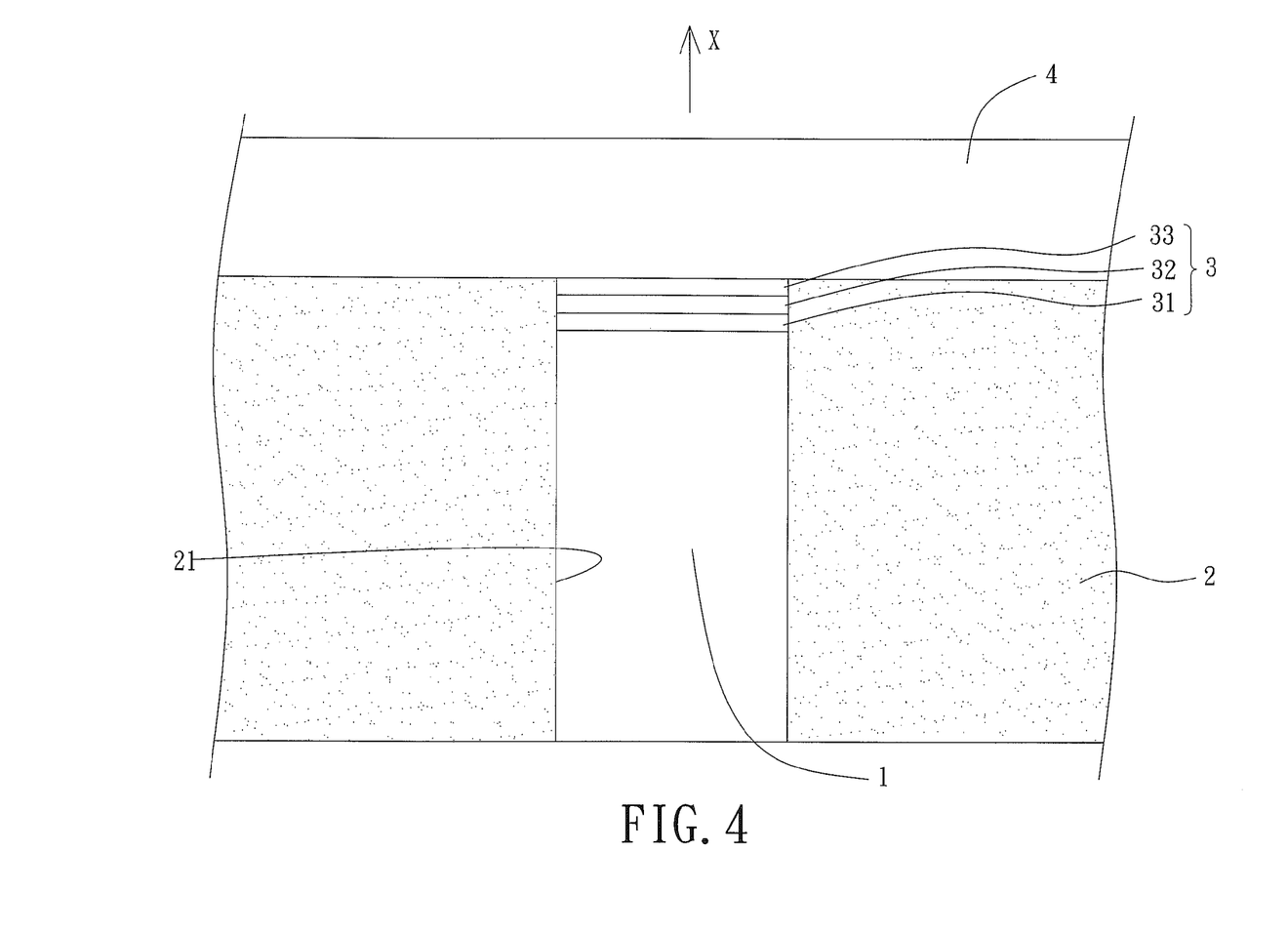
FIG. 4 is a cross sectional view of a resistive random access memory according to a fourth embodiment of the disclosure.
Figure 5:
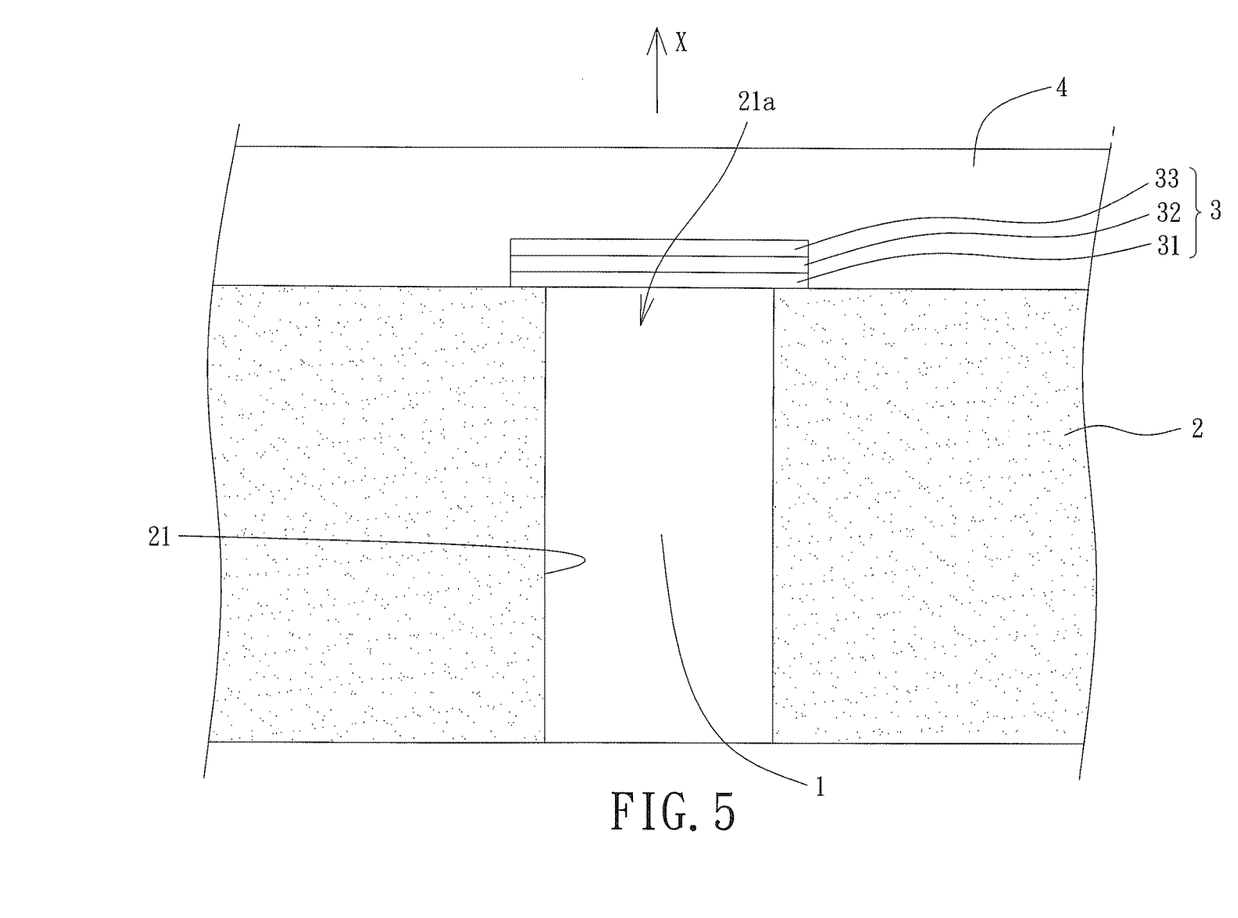
FIG. 5 is a cross sectional view of a resistive random access memory according to a fifth embodiment of the disclosure.

In similar embodiments, the first electrode 1 may be completely located in the first via-hole 21 as shown in FIGS. 4 and 5. As such, the outer periphery of the first electrode 1 may abut with the wall of the first via-hole 21. The oxygen-containing resistance changing layer 3 may be completely located in the first via-hole 21 (as shown in FIG. 4). The oxygen-containing resistance changing layer 3 may also be arranged across an opening 21a of the first via-hole 21. The oxygen-containing resistance changing layer 3 has a diameter larger than a diameter of the opening 21a (as shown in FIG. 5). Similarly, the oxygen-containing resistance changing layer 3 may include a bottom portion 31, an oxygen-rich portion 32 and a top portion 33 stacked upon one another (as shown in FIGS. 4 and 5). The first electrode 1, the enclosing layer 2 and the second electrode 4 can jointly enclose the oxygen-containing resistance changing layer 3 to enhance the limiting effect of the oxygen ions. However, this is not used to limit the disclosure.

Besides, during the use of the resistive random access memory of the embodiment of the disclosure, an electric field may be applied between the first electrode 1 and the second electrode 4 to trigger the redox reaction of the oxygen ions in the oxygen-containing resistance changing layer 3. Thus, the oxygen-containing resistance changing layer 3 can be switched between the high resistance state and the low resistance state. Since the oxygen-containing resistance changing layer 3 is enclosed by the first electrode 1, the enclosing layer 2 and the second electrode 4 which do not contain oxygen, the redox reaction can be limited in the oxygen-containing resistance changing layer 3 (the redox reaction does not take place outside the oxygen-containing resistance changing layer 3). As such, the dispersion of the oxygen ions of the oxygen-containing resistance changing layer 3 can be prevented or reduced after the resistive random access memory operates in a large number of times. As stated above, after the conventional resistive random access memory has been operated in a certain number of times (about $1*10^8$ times), said memory will be inoperable (i.e. having errors in reading the data due to the undistinguishable resistance states) due to the reduced difference between the resistances of LRS and HRS. In contrast to the conventional resistive random access memory, the resistive random access memories of the embodiments of the disclosure do not have such a problem and can provide a high durability.

In summary, in the resistive random access memories of the embodiments of the disclosure, the first electrode 1, the enclosing layer 2 and the second electrode 4 jointly enclose the oxygen-containing resistance changing layer 3, and each of the first electrode 1, the enclosing layer 2 and the second electrode 4 is made of elements not containing oxygen. As a result, the redox reaction can be limited in the oxygen-containing resistance changing layer 3, preventing or reducing the dispersion of the oxygen ions of the oxygen-containing resistance changing layer 3 after said memory operates in a large number of times. Advantageously, the distinguishability of the resistance states is not affected, and data errors do not result. Thus, the durability is high, the service life is prolonged, and the data errors are avoided.

Although the disclosure has been described in detail with reference to its presently preferable embodiments, it will be understood by one of ordinary skill in the art that various modifications can be made without departing from the spirit and the scope of the invention, as set forth in the appended claims.

What is claimed is:

1. A resistive random access memory comprising:
a first electrode;
a second electrode separate from the first electrode;
an enclosing layer forming a first via-hole; and
an oxygen-containing resistance changing layer arranged for the first via-hole, wherein the first and second electrodes and the enclosing layer jointly enclose the oxygen-containing resistance changing layer, wherein each of the first electrode, the second electrode and the enclosing layer is made of an element not containing oxygen, wherein each of the first electrode, the second electrode and the enclosing layer abuts with the oxygen-containing resistance changing layer, wherein the enclosing layer is mounted on one of the first and second electrodes, and
wherein the oxygen-containing resistance changing layer is formed from oxides doped with chlorine and is completely located in the first via-hole, wherein the first electrode is not parallel to the second electrode, wherein the enclosing layer encloses the first electrode but does not enclose the second electrode, and wherein the enclosing layer is in contact with a bottom face of the second electrode.

2. The resistive random access memory as claimed in claim 1, wherein each of the first and second electrodes is made of a metal material not containing oxygen.

3. The resistive random access memory as claimed in claim 2, wherein the metal material comprises iridium, platinum, gold, titanium nitride, hafnium, tantalum or tungsten.

4. The resistive random access memory as claimed in claim 1, wherein the enclosing layer is formed from silicon carbide.

5. The resistive random access memory as claimed in claim 1, wherein the oxygen-containing resistance changing layer extends from a top face of the one of the first and second electrodes, which is exposed to the first via-hole, to a top face of the enclosing layer, and wherein the oxygen-containing resistance changing layer forms a recess.

6. The resistive random access memory as claimed in claim 5, wherein the oxygen-containing resistance changing layer has a part that is located outside the first via-hole, and wherein the part of the oxygen-containing resistance changing layer is jointly enclosed by the enclosing layer and another one of the first and second electrodes.

7. The resistive random access memory as claimed in claim 5, wherein another one of the first and second electrodes extends out of the first via-hole from the oxygen-containing resistance changing layer and forms a second via-hole, and wherein the second via-hole is located in the first via-hole.

8. The resistive random access memory as claimed in claim 6, wherein another one of the first and second electrodes extends out of the first via-hole from the oxygen-containing resistance changing layer and forms a second via-hole, and wherein the second via-hole is located in the first via-hole.

9. The resistive random access memory as claimed in claim 1, wherein another one of the first and second electrodes extends out of the first via-hole from the oxygen-containing resistance changing layer and forms a second via-hole, wherein the second via-hole is located in the first via-hole.

10. The resistive random access memory as claimed in claim 1, wherein one of the first and second electrodes is arranged in the first via-hole.

11. The resistive random access memory as claimed in claim 1, wherein the oxygen-containing resistance changing layer comprises a bottom portion, an oxygen-rich portion and a top portion stacked upon one another, and wherein the oxygen-rich portion is formed from the oxides doped with less than 10% of a metal element.

12. The resistive random access memory as claimed in claim 1, wherein the enclosing layer is formed from boron nitride.

13. A resistive random access memory comprising:
a first electrode;
a second electrode separate from the first electrode;
an enclosing layer forming a first via-hole; and
an oxygen-containing resistance changing layer arranged for the first via-hole, wherein the first and second electrodes and the enclosing layer jointly enclose the oxygen-containing resistance changing layer, wherein each of the first electrode, the second electrode and the enclosing layer is made of an element not containing oxygen, wherein each of the first electrode, the second electrode and the enclosing layer abuts with the oxygen-containing resistance changing layer, wherein the enclosing layer is mounted on one of the first and second electrodes, wherein the oxygen-containing resistance changing layer is formed from oxides doped with boron and is completely located in the first via-hole, wherein the first electrode is not parallel to the second electrode, wherein the enclosing layer encloses the first electrode but does not enclose the second electrode, and wherein the enclosing layer is in contact with a bottom face of the second electrode.

14. A resistive random access memory comprising:
a first electrode;
a second electrode separate from the first electrode;
an enclosing layer forming a first via-hole; and
an oxygen-containing resistance changing layer arranged for the first via-hole, wherein the first and second electrodes and the enclosing layer jointly enclose the oxygen-containing resistance changing layer, wherein each of the first electrode, the second electrode and the enclosing layer is made of an element not containing oxygen, wherein each of the first electrode, the second electrode and the enclosing layer abuts with the oxygen-containing resistance changing layer, wherein the enclosing layer is mounted on one of the first and second electrodes, wherein the oxygen-containing resistance changing layer is formed from oxides doped with carbon and is completely located in the first via-hole, wherein the first electrode is not parallel to the second electrode, wherein the enclosing layer encloses the first electrode but does not enclose the second electrode, and wherein the enclosing layer is in contact with a bottom face of the second electrode.

15. A resistive random access memory comprising:
a first electrode;
a second electrode separate from the first electrode;
an enclosing layer forming a first via-hole; and
an oxygen-containing resistance changing layer arranged for the first via-hole, wherein the first and second electrodes and the enclosing layer jointly enclose the oxygen-containing resistance changing layer, wherein each of the first electrode, the second electrode and the enclosing layer is made of an element not containing oxygen, wherein each of the first electrode, the second electrode and the enclosing layer abuts with the oxygen-containing resistance changing layer, wherein the enclosing layer is mounted on one of the first and second electrodes, wherein the oxygen-containing resistance changing layer is formed from oxides doped with bromine and is completely located in the first via-hole, wherein the first electrode is not parallel to the second electrode, wherein the enclosing layer encloses the first electrode but does not enclose the second electrode, and wherein the enclosing layer is in contact with a bottom face of the second electrode.

* * * * *